United States Patent [19]

Murayama

[11] Patent Number: 4,645,685
[45] Date of Patent: Feb. 24, 1987

[54] METHOD FOR PRODUCING AN OPTICAL RECORDING MEDIUM BY A CHALCOGENIDE SUBOXIDE

[75] Inventor: Yoichi Murayama, Tokyo, Japan

[73] Assignee: Kuraray Co., Ltd., Kurashiki, Japan

[21] Appl. No.: 716,007

[22] Filed: Mar. 26, 1985

[30] Foreign Application Priority Data

Mar. 26, 1984 [JP] Japan ................................. 59-56232
Dec. 13, 1984 [JP] Japan ................................ 59-264127

[51] Int. Cl.$^4$ .............................................. B05D 3/06
[52] U.S. Cl. ...................................... 427/39; 427/166
[58] Field of Search .................. 427/38, 39, 166, 53.1, 427/162

[56] References Cited

U.S. PATENT DOCUMENTS

| | | | |
|---|---|---|---|
| 3,971,874 | 7/1976 | Ohta et al. | 427/166 |
| 4,287,224 | 9/1981 | Heimbach et al. | 427/166 |
| 4,357,366 | 11/1982 | Takaoka et al. | 427/166 |
| 4,430,366 | 2/1984 | Crawford et al. | 427/162 |
| 4,526,802 | 7/1985 | Sato | 427/39 |

Primary Examiner—John H. Newsome
Attorney, Agent, or Firm—Armstrong, Nikaido, Marmelstein & Kubovcik

[57] ABSTRACT

Chalcogenide suboxide, particularly tellurium oxides TeOx, are possible to reversibly change optical characteristics by changing power of irradiating light to repeat recording and erasure.

If the TeOx is $x<1$, high sensitivity is obtained but the characteristic of film is greatly deteriorated due to the environment.

In accordance with this invention there is proposed a film which can be used as an optical recording medium having a high sensitivity and a high stability under the conditions that a partial pressure of oxygen is in the range from $1\times10^{-4}$–$9\times10^{-3}$ Torr and a high frequency power for forming a plasma in the range of 50–500 W and wherein the TeOx film is formed by metal tellurium vapor passing through a plasma of oxygen gas.

5 Claims, 4 Drawing Figures

METHOD FOR PRODUCING AN OPTICAL RECORDING MEDIUM BY A CHALCOGENIDE SUBOXIDE

BACKGROUND OF THE INVENTION

1. Field of the Invention

The present invention relates to a method for producing an optical recording medium, particularly a chalcogenide suboxide film capable of being recorded and erased by laser light. More particularly, the invention relates to a method for producing an optical recording medium which is excellent in adhesive properties between an optical recording film and a substrate, which can maintain an optical recording characteristic for a long period of time and which is excellent in stability.

2. Prior Art of the Invention

Optical recording media so far known include a system for forming small holes or bubbles and a system for varying optical characteristics of a film by thermal energy of laser light. In the former system, at the time of recording, change in rugged shape occurs in the recording film layer and therefore the recording film or substrate tends to change in quality and corrosion with a lapse of time. Normally, two recording media have been used in the form of an air sandwich. On the other hand, in the latter, two recording media are merely used with said media bonded together, thus providing an advantage in that the producing step can be materially simplified. Among materials used for the latter, there is known a chalcogenide suboxide, particularly, a tellurium suboxide $TeO_x$, as those having a high sensitivity, that is, a material which is great in change of optical characteristic with respect to the intensity of given incident light, the x used being $0 < x < 2.0$. This material can be obtained in the form of a mixture of Te and $TeO_2$. In this specification "suboxid" indicate the mixture. However, power of irradiated light may be varied to reversibly change the optical characteristic, whereby this material is being watched in respect of the fact that recording and erasing may be suitably repeated.

Known methods for producing tellurium suboxide films include a method comprising placing powder of $TeO_2$ on a W or Mo boat type heater, and energizing the heater to effect Vacuum deposition while partially reducing the $TeO_2$; a method comprising putting a mixture of $TeO_2$ powder and various reduced metals into a quartz crucible to heat and deposit the same under vacuum phenomenon; and a method comprising using $TeO_2$ and metal Te as a separate source of evaporation to deposit them simultaneously.

However, among these methods, the former two methods are simple but have a disadvantage in that since a reducing force of the boat or reducing metal is varied during the deposition, a change in composition in a direction of film-thickness of the deposited film tends to occur.

In the above-described method which used two deposition sources, the composition is not varied in the direction of film-thickness and a uniform film may be obtained. In the film produced by said method, one in which x of $TeO_x$ is $x < 1$ is low in darkening starting temperature and high in sensitivity whereas where it is left under a relatively high temperature below the blackening starting temperature and where it is left under high humidity, a change in permeability is great. Because of this, one which is poor in sensitivity but in the range of $1 < x$ had to be used mainly in view of stability of the film.

In addition, a thickness of the optical recording film had to be increased to compensate for deterioration of absorption of light. Furthermore, there also involved disadvantages in that the adhesive properties between the formed optical recording film and the substrate is not sufficient, and it is disengaged from the substrate during the manufacture or during the use.

SUMMARY OF THE INVENTION

In view of the above-described present circumstances, the present invention provides a method for producing a chalcognide suboxide optical recording medium which is excellent in adhesive properties with the substrate, while being present in a region high in sensitivity of $x < 1$, which is less deterioration in temperature and humidity, and which has a stabilized optical recording characteristic for a long period of time.

In the present invention, metal tellurium is deposited on the substrate under the atmosphere of oxygen gas by an ion plating method.

That is, as shown in FIG. 1, which is a conceptual view, the manufacturing apparatus comprises a heating boat 2 on which metal tellurium 1 is put provided within a vacuum tank 3, a substrate holding member 8 for holding a substrate 7 opposed to the boat 2, and a high frequency exciting coil 4 disposed therebetween.

First, the interior of the vacuum tank is reduced in pressure to $5 \times 10^{-6}$ to $10^{-5}$ Torr. (Initial pressure P) Then high purity oxygen gas having a dew point of $-55°$ C. or less is introduced into the vacuum tank via a reducing valve and a gas introducing valve from a high pressure cylinder, pressure Po of which is maintained at $1 \times 10^{-4}$ to $9 \times 10^{-3}$ Torr.

In this state, a voltage is applied to the high frequency exciting coil 4 in the form of a spiral coil to a high frequency electric field to excite oxygen gas to produce a plasma. The plasma produced is controlled by the shape and size of coil, intensity of electric field and divisional pressure of oxygen gas and it can be easily controlled providing control of high accuracy.

After the plasma has been produced, the heating boat 2 is energized to heat, melt and vaporise the metal tellurium 1. Vapor pressure of the tellurium is determined by the heating temperature and the pressure within the vacuum tank 3, and the amount of vaporization of tellurium is controlled by an area of a boat opening. As shown schematically in FIG. 1, vaporized particles of tellurium having passed through the plasma are partially oxidized by collision of oxygen ion and radical within the plasma and deposit on the substrate surface together with vaporised particles not oxidized. In FIG. 1, reference numeral 5, 5' indicate vaporized particles of tellurium oxidized, and 6, 6' indicate vaporized particles not oxidized.

The intensity of power applied to the high frequency exciting coil 4 in the form of a spiral coil greatly influences on the adhesive properties between the optical recording film and the substrate, and on the stability of the optical recording medium. To achieve said object, it is necessary to limit it to a specific range. That is, preferably, high frequency power is used in the range from 50 to 500 watt (more preferably, 100 to 400 watt). That is, if the value P/A (watt/cm$^2$) obtained by dividing said high frequency power P (watt) by a sectional area A (cm$^2$) formed by the spiral coil when the high frequency exciting coil 4 shown in FIG. 1 is projected on the bottom of the vacuum tank is defined as a power density, high frequency power preferably used has the power density in the range from 0.05 to 0.52 watt/cm$^2$ (more preferably from 0.1 to 0.42 watt/cm$^2$).

If the high frequency power is outside said range and is excessively small, the effect relative to the aforementioned object is not clear and conversely, if it is excessively great, the ion bombardment effect with respect to the substrate is excessively large, because of which, where the substrate is formed from plastics, hair cracks occur in the substrate surface and optical recording film, resulting in a cause in that the substrate is deformed, which is not preferable. In addition, the adhesive properties between the substrate and the optical recording film is deteriorated which is not preferable.

BRIEF DESCRITION OF THE DRAWINGS

DETAILED DESCRIPTION OF THE PREFERRED EMBODIMENTS

The method according to this invention will be described in detail hereinafter by way of examples.

(Example 1)

Figure 1:
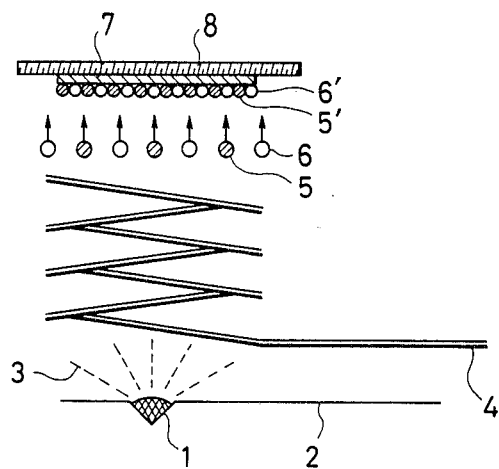
FIG. 1 is a schematic view of a high frequency ion plating apparatus for carrying out this invention.

Using an apparatus shown in FIG. 1, air is discharged till initial pressure P is $1 \times 10^{-5}$ Torr, and oxygen has is introduced till Po is equal to $5 \times 10^{-4}$ Torr. A vacuum chamber has a diameter of 1 m and a height of 1.2 m, in which a high frequency coil having an external diameter of 250 mm, number of turns of 3.5 and height of 200 mm is disposed, to which is applied a high frequency power having a frequency of 13.56 MHz and input 300 W. Metal tellurium of purity of 99.99% is maintained at temperature of 500 to 505° C. and molten and vaporized to form a film on a glass substrate surface.

With respect to the obtained film, the distribution of component between oxygen and tellurium in a direction of thickness of a film was obtained by Auger electron spectral method. The ratio of oxygen to metal tellurium is 0.73 to 0.75:1, and a fluctuation in ratio of component from the film surface to the interface with the substrate is within the aforesaid value, which is very small.

Krypton Kr laser light (wavelength: 6471 Å) was irradiated to said film to obtain a blackened irradiated trace. Visible transmittance of the irradiated portion was lowered to approximately 1/50 of transmittance of an unirradiated portion.

Figure 2:
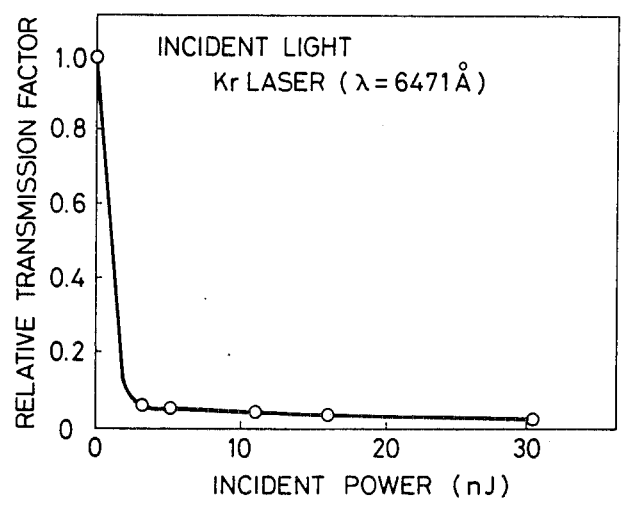
FIG. 2 is a relational view showing a laser light power and variation of permeability thereby.

The relation between the change in transmittance and the laser light irradiation power is shown in FIG. 2. It is apparent that the transmittance was greatly changed by a small power to obtain a film of high sensitivity.

(Example 2)

A tellurium suboxide film was formed on the glass substrate under the same condition as that of Example 1 except that pressure Po after introduction of oxygen gas is $1 \times 10^{-3}$ Torr.

The ratio of component between oxygen and tellurium is 0.8:1, and the relative transmittance of Kr laser light irradiating portion to an unirradiated portion was 1/55.

The obtained film was exposed under the environment of four standards in total, two standards being temperatures of 40° C. and 60° C. and another two standards being humidities of 60% RH and 85% RH, and the change by a lapse of time of the transmittance was observed after the film has been left for 10 days, 22 days, 30 days and 95 days but the change found was small.

(Example 3)

A tellurium suboxide film was formed on the glass substrate on the same condition as that of Example 1 except that Po is $1 \times 10^{-3}$ Torr and input to the high frequency exciting coil is 400 W.

The ratio between oxygen and tellurium was 1.2:1, and the lowering of the transmittance of the Kr laser light irradiated portion was 1/58.

Figure 3:
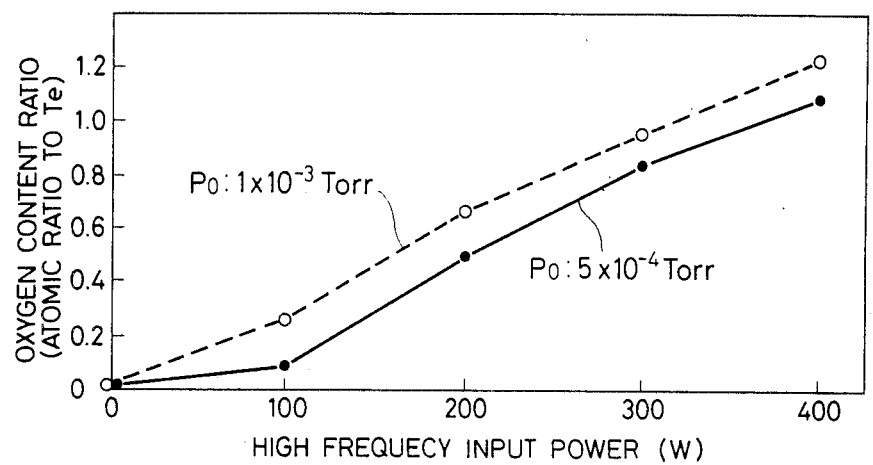
FIG. 3 is a relational view showing the ratio of component between oxygen and tellurium of a formed film with respect to oxygen partial pressure and high frequency input.

The relation between the input to the high frequency exciting coil and the ratio of component between oxygen and tellurium due to the partial pressure of oxygen and the aforesaid conditions is shown in FIG. 3 from these Examples and other experimental results. It is noted that the partial pressure of oxygen is indicated by a difference Po−P between pressure Po after introduction of oxygen gas and initial pressure P but P is sufficiently small relative to Po and it can be indicated by Po.

As the result, the tellurium suboxide film TeO$_x$ (where $0.6 < x < 1.2$) formed under the condition of partial pressure of oxygen $1 \times 10^{-4} \times 10^{-3}$ Torr is that the lowering of transmittance due to the Kr laser light irradiation was 1/50 to 1/60, and the oxygen content in the film was uniform at any point from the film surface to the interface with the substrate.

The result of peeling test in which an indentation of 3 mm square is marked on the film surface with a sharp edge to adhere a Scotch tape thereto and to raise it was that peeling between the film and the substrate surface was small and a film having a sufficient strength for practical use was obtained.

(Examples 4 to 7 and Comparative Examples A and B)

Next, the influence of high frequency power for forming a plasma will be discussed.

Using an apparatus shown in FIG. 1, air is discharged till initial pressure P is $1 \times 10^{-5}$ Torr, and oxygen gas is introduced till Po is equal to $4 \times 10^{-4}$ Torr. A vacuum chamber has a diameter of 1 m and a height of 1.2 m, in which a high frequency coil having an external diameter of 350 mm, number of turns of 3.5 and height of 200 mm is disposed, to which is applied a high frequency power having a frequency of 13.56 MHz. Metal tellurium of purity of 99.99% is maintained at temperature of 450°–500° C. and molten and vaporized to form a film on a glass substrate and a plastic substrate (polymethyl methacrylate) (Examples 4–7 and Comparative Example B). In Comparative Example A, metal tellurium and tellurium dioxide (TeO$_2$) are simultaneously heated by individual vaporizing sources without applying a high frequency power under the condition of the initial pressure P to form a film. It is noted that the partial pressure of oxygen is indicated by a difference Po−P between pressure Po after introduction of oxygen gas and initial pressure P but P is sufficiently small relative to Po and therefore it can be indicated by Po.

The change in adhesive properties and stability of the obtained film and the optical characteristic when heated assuming records by thermal energy of laser light was measured, which was shown in Table 1 together with Comparative Example.

Values of properties shown in Table 1 were obtained by the methods as follows:

Ratio between oxygen and tellurium: Signals of oxygen and tellurium were measured by the Auger electron spectral method, and the resultant ratio was used.

Adhesive properties: 100 indentations of 1 square mm were marked by a sharp edge on a film surface formed on a polymethylmethacrylate substrate, and a Scotch tape was adhered thereto and raised by 90°. o The number of indentations peeled at that time was indicated as the ratio relative to the original 100 indentations.

Stability: A recording medium formed on a glass substrate was maintained under the atmosphere of temperature of 40° C. and relative humidity of 90% to indicate it by the ratio between the transmittance (T) after left-over for a given period of time and the transmittance (To) immediately after formation of a film. In the Table, T30 represents the transmittance after left-over for 30 days.

$\Delta T/T_o$, $\Delta R/R_O$: This was obtained from the ratio between the transmittance and reflectivity when heated for 5 minutes at 250° C. and the value immediately after formation of a film.

The representative value of spectral characteristic was 830 nm.

TABLE 1

|  | Example 4 | Example 5 | Example 6 | Example 7 | Comparative example A | Comparative example B |
|---|---|---|---|---|---|---|
| High frequency power (watt) | 50 | 100 | 300 | 500 | 0 | 600 |
| Film forming speed (Å/sec) | 4 | 8 | 10 | 11 | 8 | 12 |
| Thickness (μm) | 0.1 | 0.1 | 0.1 | 0.1 | 0.1 | 0.1 |
| O/Te ratio | 0.9 | 0.9 | 0.9 | 0.9 | 0.9 | 0.9 |
| Adhesive properties (Peeled number/100) | 0 | 0 | 0 | 0 | 100 | 73 |
| T30/To | 1.0 | 1.0 | 1.0 | 1.0 | 1.3 | 1.0 |
| Change in soectral characterisitic (250° C., 5 min) $\Delta T/T_o$ (%) | 75 | 75 | 75 | 75 | 75 | 75 |
|  $\Delta R/R_o$ (%) | 71 | 71 | 71 | 71 | 71 | 71 |

It will be apparent from Table 1 that it the high frequency power is selected in the range from 50 W to 500 W in accordance with the present invention, excellent adhesive properties with the substrate and good stability may be obtained and in addition, great $\Delta T/T_o$ and $\Delta R/R_o$ may be obtained and this product can be sufficiently used as an optical recording thin film. (Examples 8, 9 and Comparative Examples C, D).

Air is discharged till initial pressure P is $1 \times 10^{-5}$ Torr, and thereafter oxygen gas is introduced till Po $= 4 \times 10^{-4}$ and a high frequency power of 200 watt is applied to generate an oxygen plasma to general metal tellurium to form a film on a glass substrate (Examples 8 and 9).

On the other hand, metal tellurium and tellurium dioxide (TeO$_2$) are simultaneously heated from individual evaporaters to form a film on a glass substrate without applying a high frequency power under the condition of initial pressure P (Comparative Examples C, D).

Figure 4:
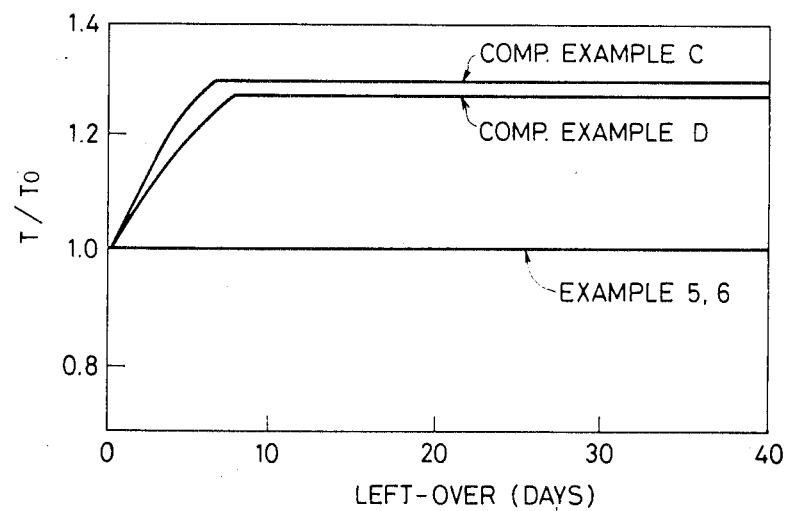
FIG. 4 shows a change by a lapse of time of a recording medium exposed to the atmosphere of temperature of 40° C. and relative humidity of 90%.

With respect to the aforesaid recording media, the change in adhesive preperties between the film and substrate, and the transmittance under the atmosphere of temperature of 40° C. and relative humidity 90% was shown in Table 2 and FIG. 4.

TABLE 2

|  | Example 5 | Example 6 | Comp. Example C | Comp. Example D |
|---|---|---|---|---|
| High frequency power (watt) | 200 | 200 | 0 | 0 |
| O/Te Ratio | 0.7 | 1.0 | 0.7 | 1.0 |
| Adhesive properties (peeled Number/100) | 0 | 0 | 100 | 100 |
| Change in spectral characteristic (250° C., 5 min $\Delta T/T_o$ (%) | 83 | 70 | 80 | 68 |

It will be apparent from Table 2 and FIG. 2 that if the high frequency power is applied in accordance with the present invention, a optical recording medium which is excellent adhesiveness and stability may be obtained, while being in high sensitivity region.

If the magnitude of the partial pressure of oxygen gas and high frequency power is selected in accordance with the present invention, tellurium particles vaporized within the vacuum tank are activated during the passage thereof in the oxygen gas plasma and partly oxidized to be deposited on the substrate. It is therefore possible to form a film and stabilized tellurium suboxide film which is hard to peed and is difficult to be affected by the environment.

The degree of oxidization varies with the partial pressure of oxygen and intensity of high frequency electric field and these may be easily controlled. Therefore, it is not only possible to make constant the ratio of component between oxygen and tellurium in a direction of thickness in the film and is easy to control the duplicability of the oxidizing degree everytime a film is formed.

Moreover, as for the manufacturing apparatus, a known ion plating apparatus having a single vaporizing source will suffice.

Accordingly, the invention has a prominent effect that a tellurium suboxide film of high sensitivity, which has been considered to fail to obtain stability, pose a problem in adhesive properties relative to the substrate and be unsuitable for practical use, may be realized in an extremely economical manner and so as to have a high stability.

What is claimed is:

1. A method for manufacturing a recording medium characterized in that a film formed from a tellurium suboxide TeO$_x$(0<x<2) is formed on a substrate by causing a metal tellurium vapor to pass through oxygen gas in the form of a plasma.

2. The manufacturing method according to claim 1 wherein formation of the oxygen gas plasma is made by a high frequency power.

3. The manufacturing method according to claim 2 wherein a partial pressure of oxygen is $1 \times 10^4 - 9 \times 10^3$ Torr.

4. The manufacturing method according to claim 3 wherein an output of the high frequency power is 50-500 W.

5. The manufacturing method according to claim 4 wherein the partial pressure of at least one oxygen and the high frequency power is constant.

* * * * *